(12) United States Patent
Furukawa et al.

(10) Patent No.: US 7,411,992 B2
(45) Date of Patent: Aug. 12, 2008

(54) LIGHT WAVELENGTH CONVERTING APPARATUS, CONTROL METHOD OF THE SAME, AND IMAGE PROJECTING APPARATUS USING THE SAME

(75) Inventors: Yukio Furukawa, Sagamihara (JP); Hajime Sakata, Hamamatsu (JP); Kazunari Fujii, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 265 days.

(21) Appl. No.: 11/120,950

(22) Filed: May 4, 2005

(65) Prior Publication Data
US 2005/0254531 A1    Nov. 17, 2005

(30) Foreign Application Priority Data
May 12, 2004    (JP)    ............................. 2004-142954

(51) Int. Cl.
*H01S 3/08*    (2006.01)
(52) U.S. Cl. .......................................... 372/96; 372/20
(58) Field of Classification Search ................... 372/20, 372/22, 29, 32, 96, 38.01, 29.011, 332, 38.07
See application file for complete search history.

(56) References Cited
U.S. PATENT DOCUMENTS
6,711,183 B1 *   3/2004   Mizuuchi et al. .............. 372/22

2003/0219046 A1*   11/2003   Kitaoka et al. ................ 372/32
2004/0066807 A1*    4/2004   Kasazumi et al. ............. 372/22
2005/0265419 A1    12/2005   Fujii et al. .................... 372/96

FOREIGN PATENT DOCUMENTS
JP    2002-043683    2/2002
JP    2004-054096  * 2/2004

* cited by examiner

*Primary Examiner*—Minsun Harvey
*Assistant Examiner*—Tuan N. Nguyen
(74) *Attorney, Agent, or Firm*—Fitzpatrick, Cella, Harper & Scinto

(57) ABSTRACT

A light wavelength converting apparatus includes a semiconductor laser having gain, phase, and DBR regions, a nonlinear optical device for receiving fundamental-wave light emitted from the semiconductor laser and outputting second harmonic wave light, a first optical detector for monitoring output of the fundamental-wave light, a second optical detector for monitoring the second harmonic wave light, and a control portion for controlling a drive current for driving the semiconductor laser. The control portion includes a control parameter determiner and wavelength controller. The control parameter determiner changes a DBR current supplied to the DBR region and a phase current supplied to the phase region to obtain a changing point, and determines a control parameter for controlling the DBR and phase currents such that the relationship therebetween is not located on the changing point. The wavelength controller controls the DBR and phase currents pursuant to the control parameter.

8 Claims, 8 Drawing Sheets

FIG.3A
(OSCILLATION WAVELENGTH)
FIG.3B
(FUNDAMENTAL-WAVE POWER)
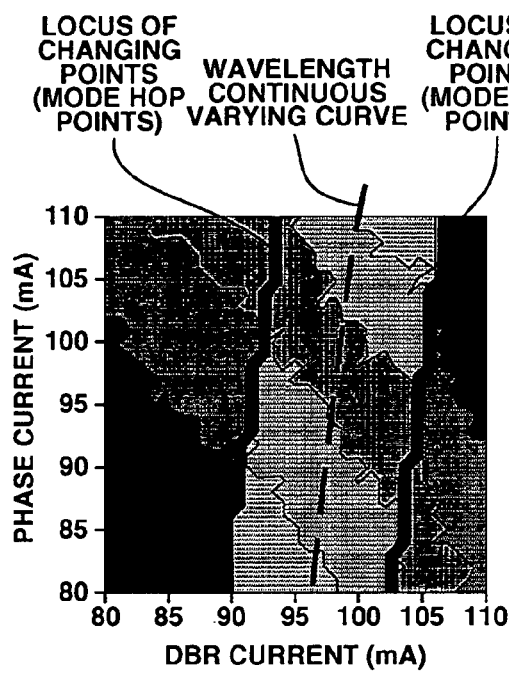
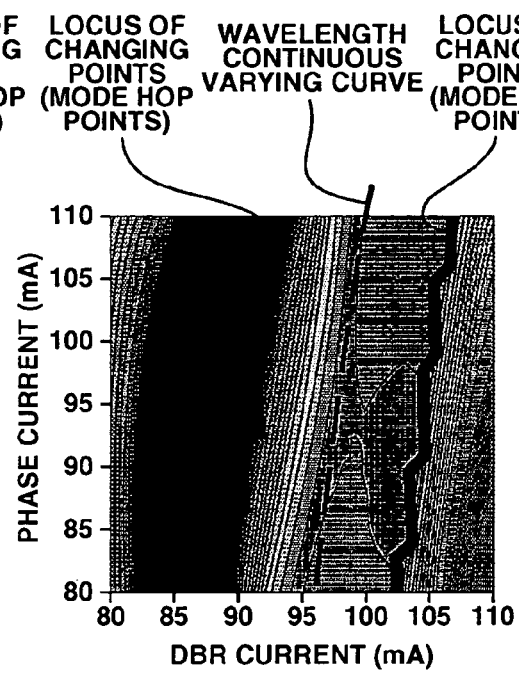
FIG.3C
(RELATIONSHIP BETWEEN POWER AND WAVELENGTH IN CASE OF PHASE CURRENT 100 mA)
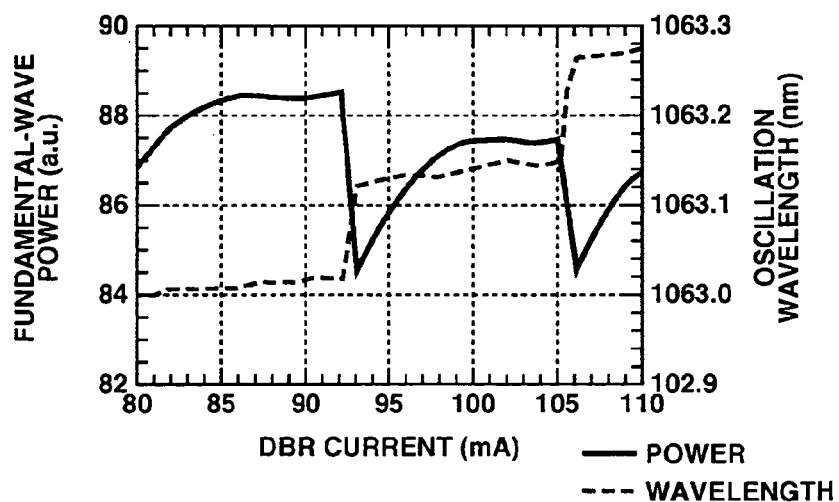

(SCAN OF DBR CURRENT FROM LOW TO HIGH)

(SCAN OF DBR CURRENT FROM HIGH TO LOW)

(CURRENT SCAN DIRECTION DEPENDENCY OF POWER IN CASE OF PHASE CURRENT 100 mA)

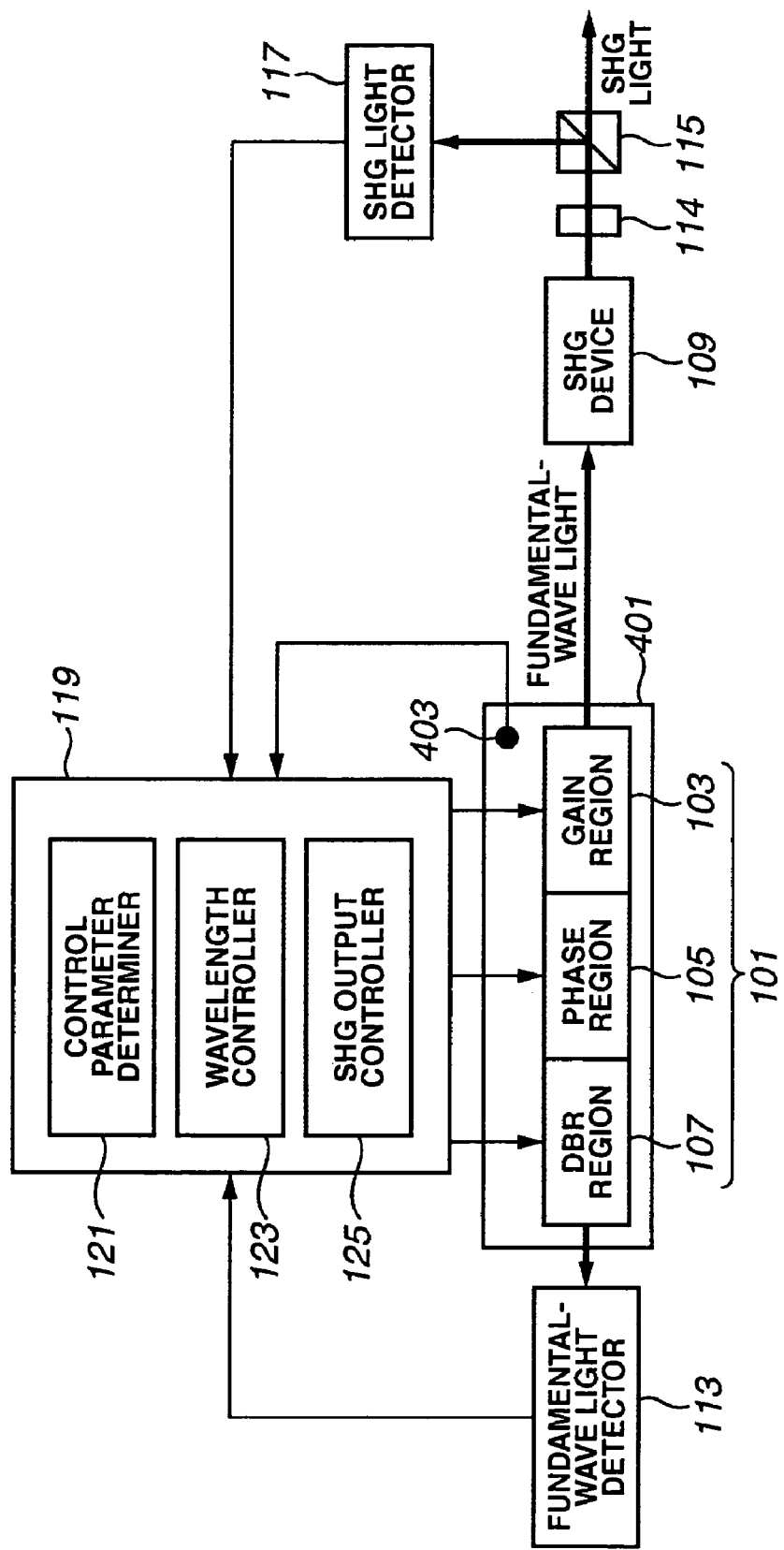

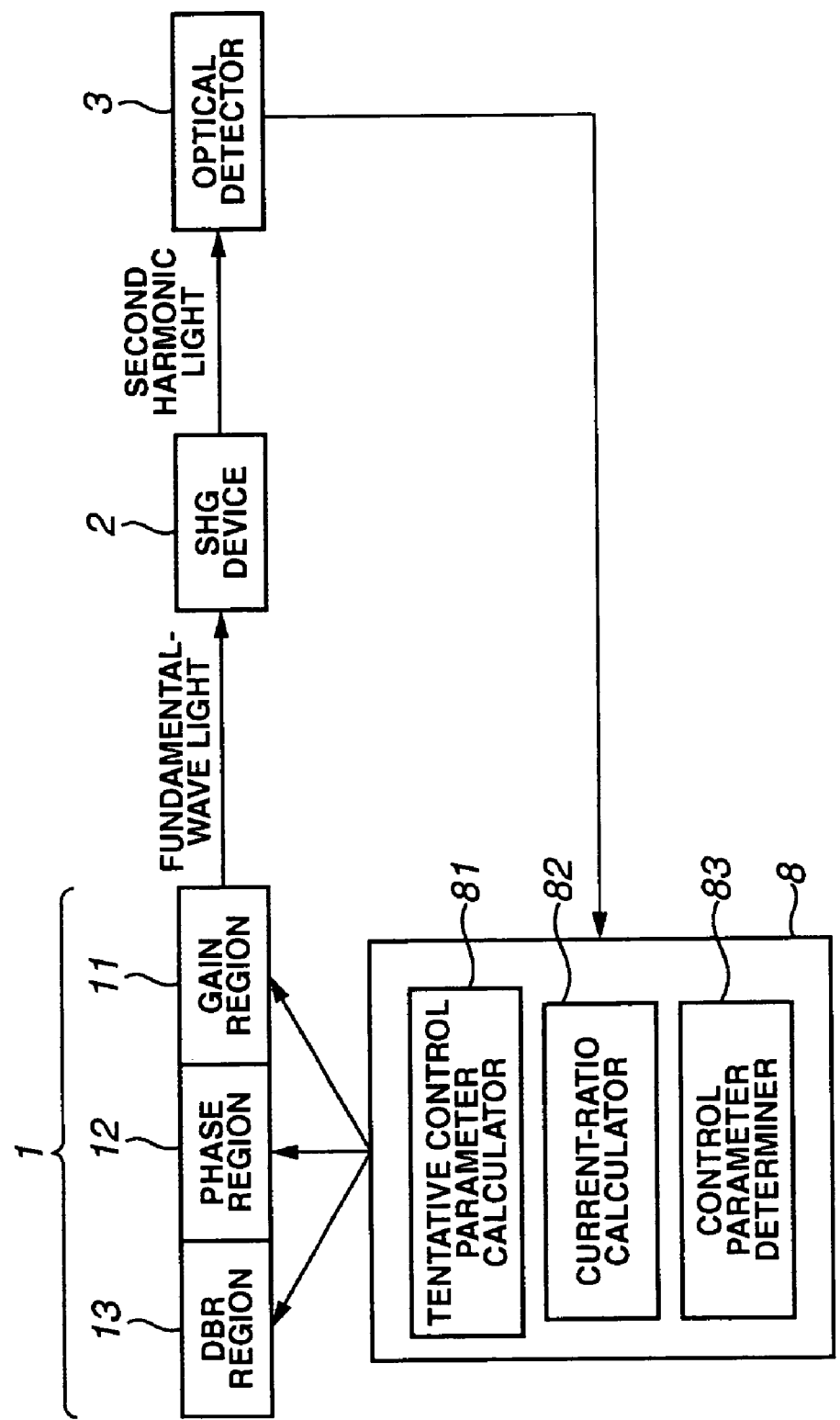

LIGHT WAVELENGTH CONVERTING APPARATUS, CONTROL METHOD OF THE SAME, AND IMAGE PROJECTING APPARATUS USING THE SAME

BACKGROUND OF THE INVENTION

1. Field of the Invention

The present invention relates to a light wavelength converting apparatus for converting light of a semiconductor laser or a laser diode (LD) into second harmonic wave light, and particularly relates to a light wavelength converting apparatus for emitting laser light, which is capable of high-speed modulation driving, and can be used as a light source for laser display, optical recording, optical measurement, etc.

2. Description of the Related Background Art

A variety of attempts for conversion of LD light into light at another wavelength have been made using a nonlinear optical material. According to such technology, it becomes possible to generate laser light in a wavelength range, such as a green range or an ultraviolet range, that is not yet put into practice with the LD. Such a light source can be expected to be usable as a light source for laser display or optical recording. Particularly, research and development have been widely conducted with respect to a harmonic generation (SHG) system in which fundamental-wave light is input into a nonlinear optical material to generate light whose wavelength is half of that of the fundamental-wave light (second harmonic wave light). In connection therewith, Japanese Patent Application Laid-Open No. 2002-43683 discloses a driving method which is used when SHG light is generated using fundamental-wave light emitted from a distributed Bragg reflection (DBR) semiconductor laser.

FIG. 8 illustrates the driving method. In FIG. 8, a DBR semiconductor laser 1 is comprised of a gain region 11, a phase region 12 and a DBR region 13 with a diffraction grating, and the laser 1 emits fundamental-wave light. Temperatures of the phase region 12 and the DBR region 13 are controlled by injecting current perpendicularly to a pn junction provided therein, or injecting current into a thin-film heater provided therein. The refractive index of a waveguide is changed by such a change in the temperature. Phase and reflectivity for the fundamental-wave light in the DBR semiconductor laser 1 are accordingly adjusted to vary oscillation wavelength.

The fundamental-wave light is input into an SHG device 2. The SHG device 2 converts the wavelength of the fundamental-wave light, and outputs SHG light. The SHG light is input into an optical detector 3. The optical detector 3 converts the SHG light into an electrical signal. A control portion 8 includes a tentative control parameter calculator 81, a current-ratio calculator 82, and a control parameter determiner 83. The control portion 8 outputs a phase control current for the phase region 12 and a DBR drive current for the DBR region 13, based on the electrical signal from the optical detector 3.

Operation of the apparatus illustrated in FIG. 8 will now be described. An LD drive current is supplied to the gain region 11 of the DBR semiconductor laser 1 to drive the laser 1. The fundamental-wave light is accordingly output from the laser 1. The wavelength of the fundamental-wave light is converted by the SHG device 2, and SHG light is emitted therefrom. The SHG light is converted into an electrical signal by the optical detector 3. From the electrical signal, the control portion 8 determines a control parameter for controlling the phase control current and the DBR drive current without occurrence of any mode hop. The DBR semiconductor laser 1 is driven pursuant to the control parameter.

With the SHG device 2, a wavelength range having a large conversion efficiency is limited. Accordingly, when the wavelength of the fundamental-wave light is changed by controlling the currents injected into the phase region 12 and the DBR region 13, a range of the SHG light capable of being monitored by the optical detector 3 is likely to be very narrow. It is hence difficult to estimate the control parameter with high precision.

Therefore, in the apparatus of FIG. 8, a width of a wavelength capable of being shifted without occurrence of any mode hop is small. Further, when the wavelength range of the SHG device 2 having a large conversion efficiency is shifted due to a change in the device temperature, the control parameter needs to be changed. However, the apparatus of FIG. 8 does not consider such a situation. In other words, it is assumed in the apparatus of FIG. 8 that a temperature stabilizing mechanism, such as a Peltier device, for stabilizing temperature of the SHG device 2 and the semiconductor laser 1 at a constant value is used. Power consumption is therefore likely to increase in the apparatus of FIG. 8.

SUMMARY OF THE INVENTION

It is an object of the present invention to provide techniques for improving a light wavelength converting apparatus.

According to one aspect of the present invention, there is provided a light wavelength converting apparatus which includes a semiconductor laser having a gain region, a phase region, and a distributed Bragg reflection (DBR) region provided with a distributed Bragg reflector; a nonlinear optical device adapted to receive fundamental-wave light emitted from the semiconductor laser and to output second harmonic wave light of the fundamental-wave light; a first optical detector for monitoring an output of the fundamental-wave light; a second optical detector adapted to monitor an output of the second harmonic wave light such that the second harmonic wave light can be controlled; and a control portion for controlling at least a drive current for driving the semiconductor laser.

The control portion includes a control parameter determiner, and a wavelength controller. The control parameter determiner is adapted to change a DBR current supplied to the DBR region and a phase current supplied to the phase region to obtain a changing point that corresponds to a discontinuous change in an electrical signal from the first optical detector, and to determine a control parameter for controlling the DBR current and the phase current such that the relationship between the DBR current and the phase current is not located in the changing point. The wavelength controller is adapted to control the DBR current and the phase current pursuant to the control parameter, such that an oscillation wavelength of the semiconductor laser can be continuously controlled.

According to another aspect of the present invention, there is provided a control method of controlling a light wavelength converting apparatus which includes a semiconductor laser provided with again region, a phase region, and a distributed Bragg reflection (DBR) region with a distributed Bragg reflector, a nonlinear optical device adapted to receive fundamental-wave light emitted from the semiconductor laser and to output second harmonic wave light of the fundamental-wave light, a first optical detector for monitoring an output of the fundamental-wave light, and a second optical detector adapted to monitor the second harmonic wave light such that the second harmonic wave light can be controlled.

The control method includes a step of changing a DBR current supplied to the DBR region and a phase current supplied to the phase region to obtain a changing point that corresponds to a discontinuous change in an electrical signal from the first optical detector, a step of determining a control parameter for controlling the DBR current and the phase current such that the relationship between the DBR current and the phase current is not located in the changing point, and a wavelength control step of controlling the DBR current and the phase current pursuant to the control parameter, such that an oscillation wavelength of the semiconductor laser can be continuously controlled.

In the wavelength control step, the oscillation wavelength can be continuously swept always or at predetermined intervals such that the second harmonic wave light can be controlled at a constant value or at a maximum value. Such a control can be carried out by implementing a program for executing those steps in the control portion for controlling the drive current of the semiconductor laser, for example.

According to another aspect of the present invention, there is provided an image projecting apparatus (including an image displaying apparatus, such as a laser display, and an image forming apparatus such as a laser printer having a photosensitive member) which includes the light wavelength converting apparatus as recited above, and at least an optical scanning device. Second harmonic wave light output from the light wavelength converting apparatus is scanned by the optical scanning device to form an image.

According to the present invention, it is possible to achieve a light wavelength converting apparatus which does not necessarily require temperature stabilizing mechanism, such as a Peltier device, and is capable of being driven by reduced consumption power.

These advantages, as well as others, will be more readily understood in connection with the following detailed description of the preferred embodiments and examples of the invention in connection with the drawings.

BRIEF DESCRIPTION OF THE DRAWINGS

FIGS. 3A to 3C are graphs showing relationships between DBR current, phase current, oscillation wavelength and light power, respectively, in the first embodiment.

FIG. 5 is a block diagram illustrating the structure of a third embodiment of a light wavelength converting apparatus according to the present invention.

FIG. 8 is a block diagram illustrating the structure of a conventional light wavelength converting apparatus.

DETAILED DESCRIPTION OF THE PREFERRED EMBODIMENTS

Embodiments of the present invention will hereinafter be described with reference to the drawings.

Figure 1:
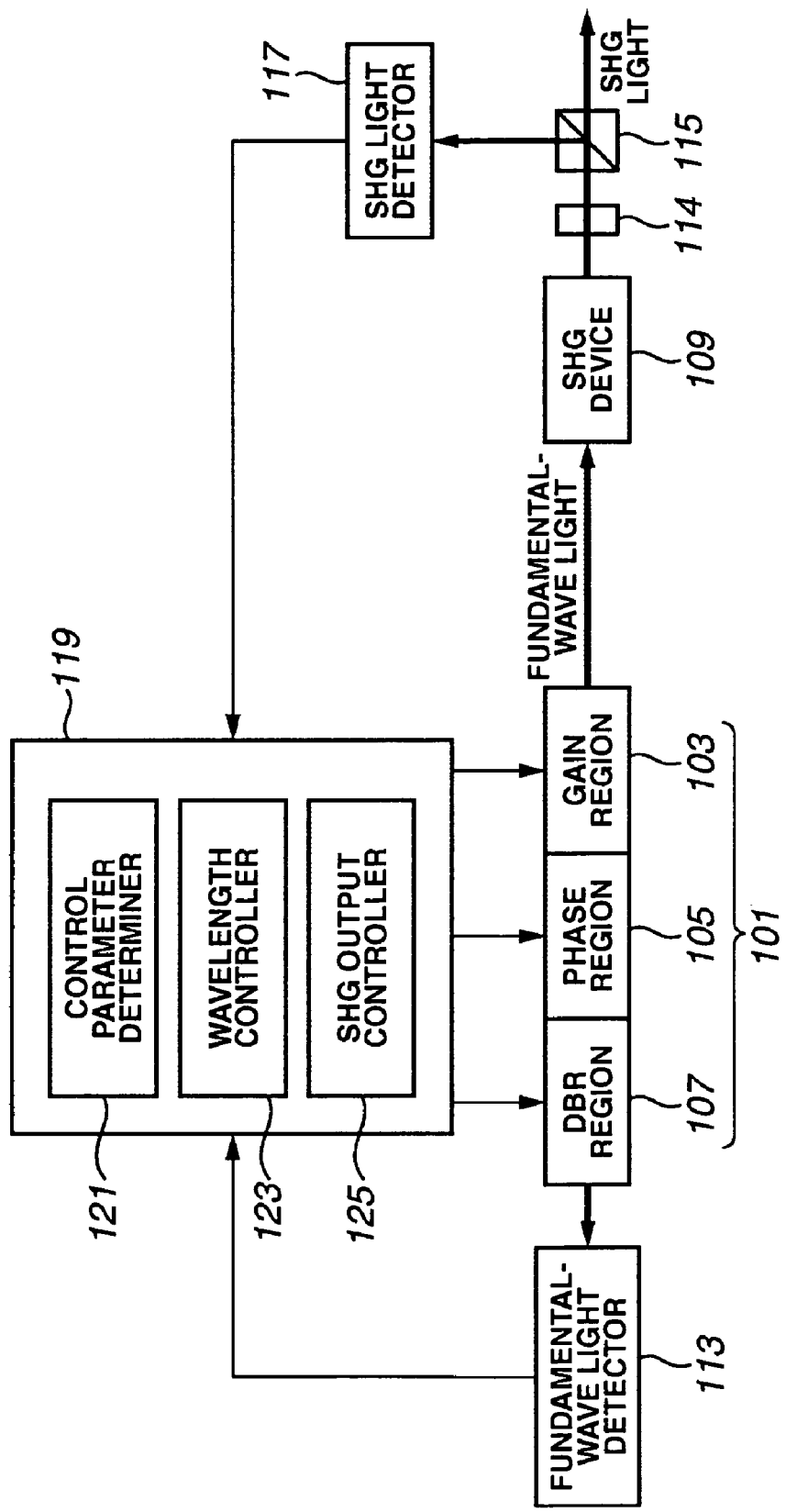
FIG. 1 is a block diagram illustrating the structure of a first embodiment of a light wavelength converting apparatus according to the present invention.

FIG. 1 illustrates the structure of a first embodiment of a light wavelength converting apparatus according to the present invention. As illustrated in FIG. 1, a DBR semiconductor laser 101 includes a gain region 103, a phase region 105, and a DBR region 107 provided with a diffraction grating. The DBR semiconductor laser 101 emits fundamental-wave light. Temperatures of the phase region 105 and the DBR region 107 are controlled by injecting current perpendicularly to a pn junction provided therein, or injecting current into a thin-film heater provided therein. The refractive index of a waveguide is changed by such a change in the temperature. Phase and reflectivity for the fundamental-wave light in the DBR semiconductor laser 101 are accordingly adjusted to vary oscillation wavelength.

Fundamental-wave light emitted from a rear side of the semiconductor laser 101 is input into a fundamental-wave light detector 113. The fundamental-wave light detector 113 converts power of the fundamental-wave light into an electrical signal, and the electrical signal is supplied to a control portion 119.

An SHG device 109 receives the fundamental-wave light, converts the wavelength of the fundamental-wave light, and outputs SHG light. After transmission through a fundamental-wave light cut filter 114, a portion of the output SHG light is separated by a beam splitter 115, and input into an SHG light detector 117. The SHG light detector 117 converts power of the SHG light into an electrical signal, and the electrical signal is also supplied to the control portion 119. The control portion 119 is comprised of a control parameter determiner 121, a wavelength controller 123, and an SHG output controller 125.

Operation of the above-discussed light wavelength converting apparatus will now be described. Initially, a phase control current injected into the phase region 105 and a DBR drive current injected into the DBR region 107 are controlled under a condition in which a predetermined gain current is injected into the gain region 103. A change in the output of the fundamental-wave light is monitored by the fundamental-wave light detector 113.

Based on the electrical signal from the fundamental-wave light detector 113, the control parameter determiner 121 determines a relationship (a control parameter) between the DBR current and the phase current to be injected into the DBR region 107 and the phase region 105, respectively, such that no mode hop occurs. More specifically, changing points, or points at which power of the fundamental-wave light changes discontinuously due to a mode hop, are detected when the DBR current and the phase current are changed, and the relationship between the DBR current and the phase current is determined such that the relationship is not located in the changing point. The wavelength controller 123 controls the DBR current and the phase current pursuant to the control parameter. Accordingly, it is possible to control the oscillation wavelength of the DBR semiconductor laser 101 continuously.

On the other hand, the SHG output controller 125 controls power of the SHG light to be at a predetermined value based on the electrical signal from the SHG light detector 117. The wavelength of fundamental-wave light can be continuously controlled in a wide range since the relationship (the control parameter) between the DBR current and the phase current is obtained from the changing points of power of the fundamental-wave light. Therefore, it is possible to change the oscillation wavelength of the semiconductor laser 101 such that the output of SHG light is maximized, even when a wavelength range, in which the conversion efficiency of the SHG device 109 is large, is shifted due to a change in the device temperature.

More specific embodiments will be described with reference to the drawings in the following.

As noted above, FIG. 1 illustrates a DBR semiconductor laser 101 which is comprised of a gain region 103, a phase region 105, and a DBR region 107. According to the first embodiment of the present invention, DBR semiconductor laser 101 emits fundamental-wave light at a wavelength of approximately 1060 nm. Fundamental-wave light emitted from a rear side of the semiconductor laser 101 is input into a fundamental-wave light detector 113. The fundamental-wave light detector 113 converts power of the fundamental-wave light into an electrical signal, and the electrical signal is supplied to a control portion 119.

An SHG device 109 also receives the fundamental-wave light, converts the wavelength of the fundamental-wave light, and outputs SHG light at a wavelength of approximately 530 nm. After transmission through a fundamental-wave light cut filter 114, a portion of the output SHG light is separated by a beam splitter 115, and input into an SHG light detector 117. The SHG light detector 117 converts power of the SHG light into an electrical signal, and the electrical signal is supplied to the control portion 119.

Figure 2:
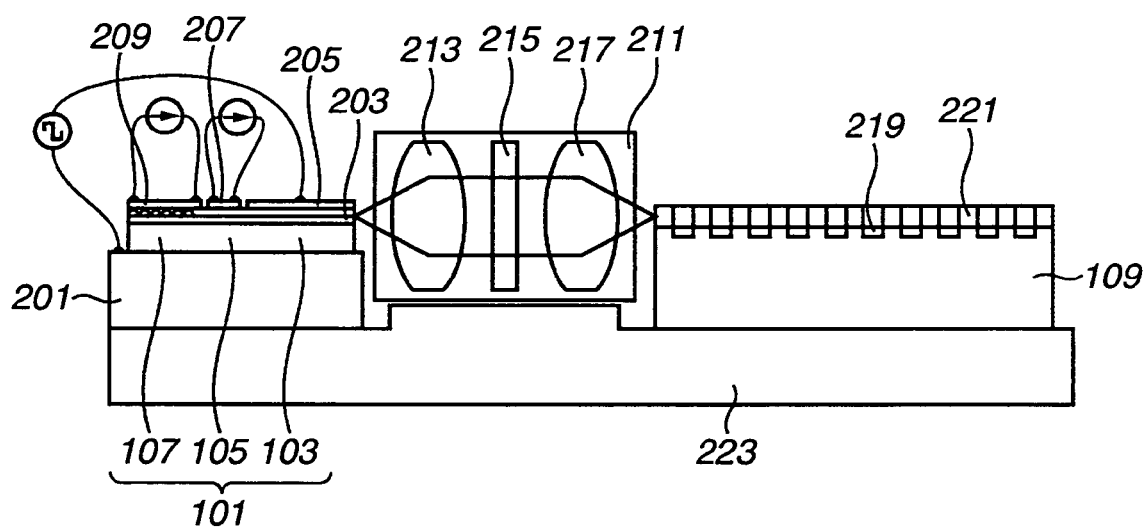
FIG. 2 is a cross-sectional view schematically illustrating the structure of a light wavelength converting device according to the first embodiment.

The semiconductor laser 101 and the SHG device 109 of the first embodiment will now be described in more detail with reference to FIG. 2. FIG. 2 is a cross-sectional view illustrating a light wavelength converting device of the first embodiment. The DBR semiconductor laser 101 is mounted on a sub-mount 201. An electrode 205 is formed such that a current can be injected into an active layer 203 provided in the gain region 103. Thin-film heaters 207 and 209 are formed on surfaces of the phase region 105 and the DBR region 107, respectively. When current is injected into thin-film heaters 207 and 209, temperatures of regions 105 and 107 are changed. Accordingly, the oscillation wavelength of the laser 101 can be controlled.

Further, a collimator lens 213, a half-wave plate 215, and a condenser lens 217 are arranged in a lens mount 211. The SHG device 109 is comprised of an LiNbO$_3$(LN) device with a device length of approximately 10 mm. The SHG device 109 is provided with a periodically domain-inverted structure 219 with a predetermined period matching the wavelength of the fundamental-wave light, and a waveguide 221 formed by ion exchange. The sub-mount 201, the lens mount 211, and the SHG device 109 are fixed on a heat sink 223 in an aligned arrangement.

FIGS. 3A to 3C show relationships between DBR current, phase current, oscillation wavelength and light power, respectively, of the above-discussed DBR semiconductor laser 101 of the first embodiment. FIG. 3A shows the relationship between the DBR current, the phase current, and the oscillation wavelength, in which lines extending from upper left to lower right indicate equi-wavelength lines, the oscillation wavelength continuously changes in portions depicted in various densities except locus portions of changing points, and in which the oscillation wavelength increases from lower left to upper right. FIG. 3B shows the relationship between the DBR current, the phase current, and the light power, in which lines extending from top to bottom indicate equi-power lines, and in which the light power continuously changes in portions depicted in various densities except locus portions of changing points. FIG. 3C shows the relationship between the DBR current, the oscillation wavelength, and the light power at the time when the phase current is kept constant (here 100 mA).

Under a certain current condition, each of the oscillation wavelength and the light power varies discontinuously because of occurrence of a mode hop, but discontinuous points of the oscillation wavelength and the light power appear at the same location.

Therefore, loci of changing points (mode hop points) are obtained from the change in the output of the fundamental-wave light, and the DBR current and the phase current are controlled such that the relationship between the DBR current and the phase current is approximately located on a central line between those loci. The wavelength of the fundamental-wave light can be continuously shifted by such a control even if no monitoring means for monitoring the wavelength of the fundamental-wave light is provided. Although there exist a plurality of loci of changing points, it is possible to determine a wavelength continuous varying curve, pursuant to which the DBR current and the phase current are controlled, based on two adjacent loci appropriately selected from the plural loci.

In the DBR semiconductor laser using the thin-film heater, an increase in temperature due to current injected into the heater is proportional to the square of the current, and a change in the refractive index of semiconductor (i.e., a change in the phase) is proportional to a change in the temperature. Accordingly, the locus of changing points can be approximately represented by $$a \cdot I_{DBR}^2 + b \cdot I_{phase}^2 = c$$

where $I_{DBR}$ is the DBR current, $I_{phase}$ is the phase current, a and b are proportional coefficients, respectively, and c is a constant.

Although a plurality of loci of changing points exist, it can be approximately assumed that each of the proportional coefficients a and b remains unchanged for any locus, and only the constant c varies in accordance with the locus. Where constants of two adjacent loci are c(i) and c(i+1), respectively, the wavelength continuous varying curve can be represented by $$a \cdot I_{DBR}^2 + b \cdot I_{phase}^2 = (c(i) + c(i+1))/2$$

The control parameter determiner 121 has a function of obtaining those parameters a, b and c.

The determination of the wavelength continuous varying curve is not limited to the above-discussed description. It can also be carried out by fitting to an appropriate function from discretely-detected changing points, or by connecting changing points with straight lines to create a zigzag locus of changing points.

The first embodiment can be controlled in the following manner.

Step 1: The control parameter determiner 121 obtains the control parameter for the DBR current and the phase current using the above method.

Step 2: The wavelength controller 123 shifts the DBR current and the phase current based on the thus-obtained control parameter such that the DBR and phase currents trace the wavelength continuous varying curve. The wavelength controller 123 determines the DBR current and the phase current such that power of the SHG light can be maximized, or such that the conversion efficiency from the fundamental-wave light to the SHG light can be maximized.

Step 3: The SHG output controller 125 controls the gain current injected into the gain region 103 such that power of the SHG light reaches a desired value. This step is effective when the control of the output is necessary.

Step 4: The wavelength controller 123 changes the DBR current and the phase current always or at predetermined intervals around present current values along the wavelength continuous varying curve, and determines the DBR current and the phase current therefrom such that power of the SHG light is maximized, or such that the conversion efficiency from the fundamental-wave light to the SHG light is maximized.

Step 5: Operations of the steps 3 and 4 are repeated.

Step 6: Operation of the step 1 is performed at intervals longer than the predetermined interval in the step 4 to obtain a new control parameter. Alternatively, when a mode hop occurs, i.e., when power of the fundamental-wave light or the SHG light changes discontinuously, operation of the step 1 is performed to obtain a new control parameter.

Step 7: Operations from the step 1 to the step 6 are repeated.

The light wavelength converting apparatus of the first embodiment was driven without any special temperature stabilizing mechanism. At an atmospheric temperature of 25° C., SHG light having power of 2 mW could be obtained from fundamental-wave light having power of 100 mW. Further, when the atmospheric temperature was changed under a condition in which the apparatus was controlled such that power of the SHG light reached 1.5 mW, the apparatus could be stably controlled in a range between 10° C. and 40° C. without occurrence of a mode hop.

In the first embodiment, the refractive index is controlled by injection of current into the thin-film heater to change the wavelength. Power consumption of the thin-film heater is in a range from about 0.1 W to about 0.2 w. This power consumption in such a method is advantageously low, as compared with power consumption from 1 W to several watts in a case where temperature is stabilized using temperature stabilizing mechanism such as a Peltier device.

A description will now be given for a second embodiment of a light wavelength converting apparatus with reference to FIGS. 4A to 4C. In the first embodiment, two adjacent loci of the changing points are acquired to determine the wavelength continuous varying curve from a central line between these two adjacent loci. On the other hand, in the second embodiment, the wavelength continuous varying curve is determined from a line created by averaging a central line between two adjacent loci of changing points appearing when the DBR current and the phase current are changed in a forward direction, and a central line between two adjacent loci of changing points appearing when the DBR current and the phase current are changed in a backward direction. As for the other points, the second embodiment is the same as the first embodiment.

Figure 4A:
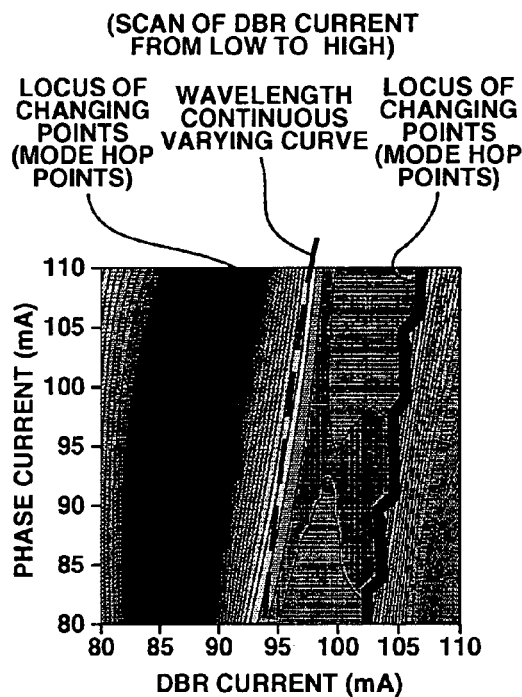
FIGS. 4A to 4C are graphs showing relationships of hysteresis of DBR current, phase current, oscillation wavelength and light power, respectively, in a second embodiment of a light wavelength converting apparatus according to the present invention.
Figure 4B:
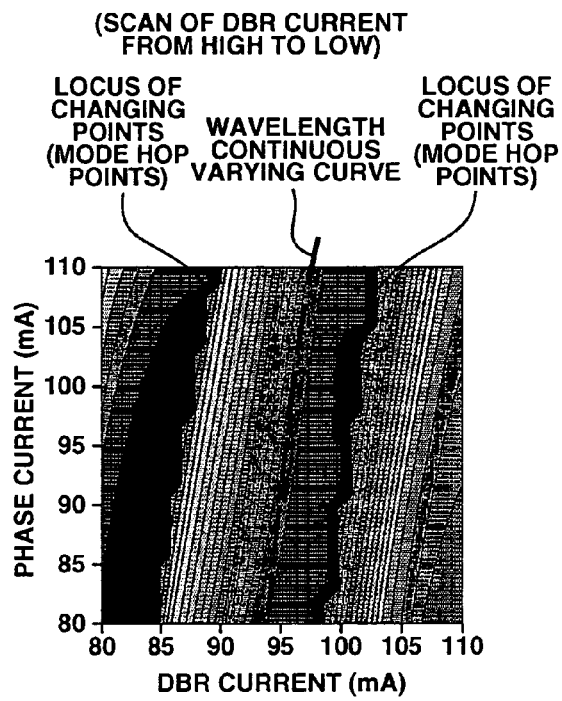
Figure 4C:
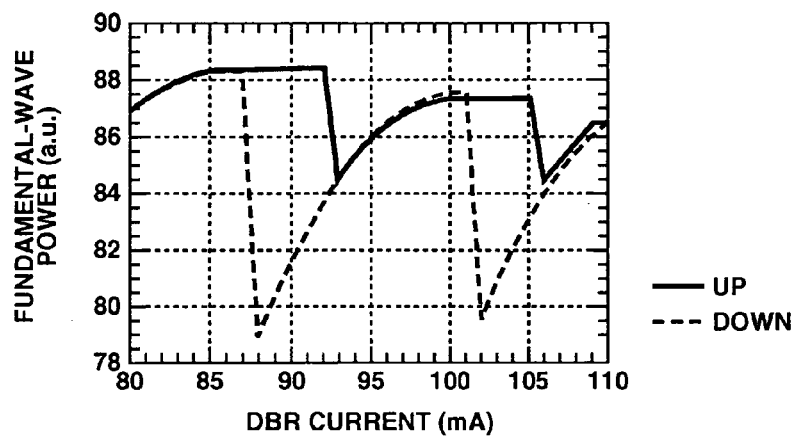

FIGS. 4A to 4C show relationships between DBR current, phase current, and light power, respectively, at the time when the DBR current and the phase current are changed in the forward direction (a current-increasing direction) or in the backward direction (a current-decreasing direction). In other words, FIG. 4A shows the relationship between the DBR current, the phase current, and the light power when the DBR current is changed in the forward direction. FIG. 4B shows the relationship between the DBR current, the phase current, and the light power when the DBR current is changed in the backward direction. FIG. 4C shows the relationship between the DBR current and the light power at the time when the phase current is kept constant (here 100 mA).

It is generally known that when a multi-electrode DBR semiconductor laser is driven, positions of mode hop appearing when current is changed in the forward direction differ from those appearing when current is changed in the backward direction (referred to as hysteresis). FIGS. 4A to 4C clearly exhibit such a phenomenon.

Accordingly, it is preferable to determine the wavelength continuous varying curve considering hysteresis. The apparatus of the second embodiment is expected to be controlled more stably than the first embodiment, because the wavelength continuous varying curve is approximately determined from the line created by averaging the central line between two adjacent loci of changing points appearing when the DBR current and the phase current are changed in the forward direction, and the central line between two adjacent loci of changing points appearing when the DBR current and the phase current are changed in the backward direction.

The light wavelength converting apparatus of the second embodiment was driven without any special temperature stabilizing mechanism. At an atmospheric temperature of 25° C., SHG light having power of 2 mW could be obtained from fundamental-wave light having power of 100 mW. Further, when the atmospheric temperature was changed under a condition in which the apparatus of the second embodiment was controlled such that power of the SHG light reached 1.5 mW, the apparatus could be stably controlled in a range between 5° C. and 45° C. without occurrence of a mode hop.

A description will now be given for a third embodiment of a light wavelength converting apparatus with reference to FIG. 5. FIG. 5 illustrates the structure of a light wavelength converting apparatus of the third embodiment. In FIG. 5, the same portions or elements as those in FIG. 1 are designated by the same reference numerals.

The third embodiment is different from the first embodiment in that a temperature sensor 403 for supplying temperature information to the control portion 119 is provided on a sub-mount 401 on which the DBR semiconductor laser 101 is mounted, and in that the wavelength controller 123 stores a correcting coefficient for the temperature information from the temperature sensor 403. As for the other points, the third embodiment is the same as the first embodiment.

In the first embodiment, the wavelength continuous varying curve is represented by $$a \cdot I_{DBR}^2 + b \cdot I_{phase}^2 = (c(i)+c(i+1))/2$$

In this formula, the proportional coefficients a and b were determined to remain almost unchanged even if the temperature of the laser changes, and the constant c(i) is dependent on the temperature and varies approximately in a proportional manner to a change in the temperature. In the third embodiment, therefore, the wavelength controller 123 stores the correcting coefficient for the temperature information from the temperature sensor 403 beforehand.

In the third embodiment, the wavelength continuous varying curve is represented by $$a \cdot I_{DBR}^2 + b \cdot I_{phase}^2 = (c(i)+c(i+1))/2 + d \cdot DT$$

where d is the correcting coefficient, and DT is the amount of a change in the temperature.

In the third embodiment, the control parameter acquired by the control parameter determiner 121 is corrected based on the temperature information, and the corrected parameter is used for control of the wavelength. Accordingly, the third embodiment is expected to be stably controlled in a wider temperature range than the first embodiment.

The third embodiment can be controlled in a manner similar to that of the first embodiment. However, operation step 4 should be modified as follows.

Step 4: The wavelength controller 123 corrects the control parameter based on the information from the temperature sensor 403 always or at predetermined intervals, and changes the DBR current and the phase current around present current values along a corrected wavelength continuous varying curve to determine the DBR current and the phase current therefrom such that power of the SHG light is maximized, or such that the conversion efficiency from the fundamental-wave light to the SHG light is maximized.

The light wavelength converting apparatus of the third embodiment was driven without any special temperature stabilizing mechanism. At an atmospheric temperature of 25° C., SHG light having power of 2 mW could be obtained from fundamental-wave light having power of 100 mW. Further, when the atmospheric temperature was changed under a condition in which the apparatus was controlled such that power of the SHG light reached 1.5 mW, the apparatus could be stably controlled in a range between 0° C. and 53° C. without occurrence of a mode hop.

Figure 6:
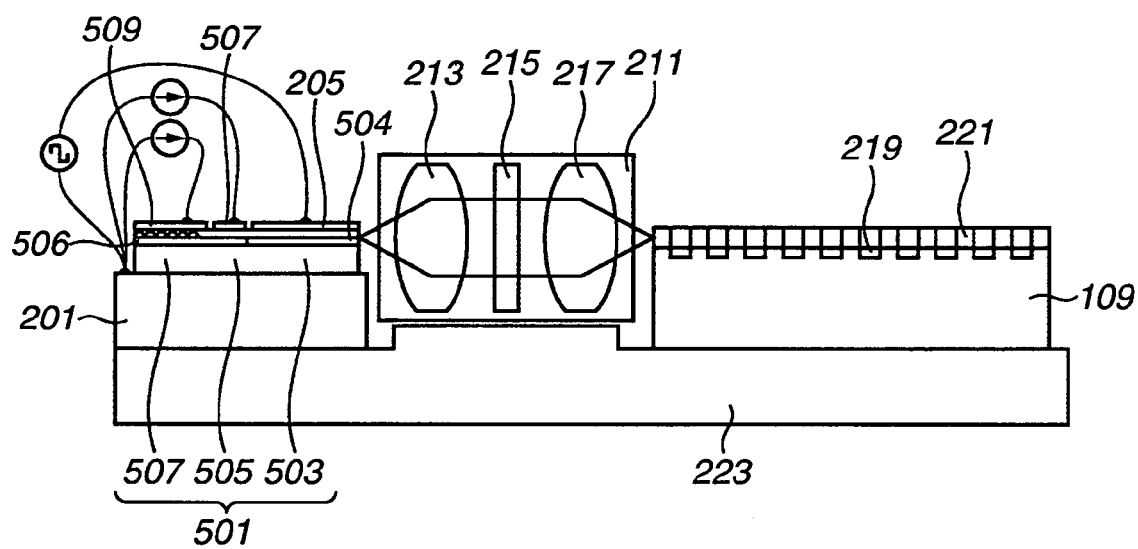
FIG. 6 is a cross-sectional view schematically illustrating the structure of a light wavelength converting device in a fourth embodiment of a light wavelength converting apparatus according to the present invention.

A description will now be given for a fourth embodiment of a light wavelength converting apparatus with reference to FIG. 6. FIG. 6 illustrates the structure of a light wavelength converting device which is a portion of a light wavelength converting apparatus of the fourth embodiment. In FIG. 6, the same portions or elements as those in FIG. 2 are designated by the same reference numerals.

The fourth embodiment uses a DBR semiconductor laser of a type in which the refractive index of a semiconductor layer is changed by injection of current thereinto. In FIG. 6, a DBR semiconductor laser 501 is mounted on the sub-mount 201, and an electrode 205 is formed such that a current can be injected into an active layer 504 provided in a gain region 503. In a phase region 505 and a DBR region 507, the active layer is removed, and a semiconductor layer 506 with a wider band gap is formed therein by regrowth. Further, electrodes 507 and 509 are formed such that carriers can be injected into the semiconductor layer 506. When carriers are injected into the semiconductor layer 506, the refractive index of the layer 506 can be changed, and the oscillation wavelength can hence be controlled. As for the other points, the fourth embodiment is the same as the first embodiment.

In the DBR semiconductor laser whose wavelength can be changed by injection of carriers, a change in the refractive index of the semiconductor is approximately proportional to the density of carriers, and a change in the density of carriers is approximately proportional to the amount of injected current. Further, an increase in temperature due to the injection of current is proportional to the square of the current. Therefore, a locus of changing points can be approximately represented by $$a_1 \cdot I_{DBR} + a_2 \cdot I_{DBR}^2 + b_1 \cdot I_{phase} + b_2 \cdot I_{phase}^2 = c/2$$

where $I_{DBR}$ is the DBR current, $I_{phase}$ is the phase current, $a_1$, $a_2$, $b_1$ and $b_2$ are proportional coefficients, respectively, and c is a constant.

Although a plurality of loci of changing points exist, it can be approximately assumed that each of the proportional coefficients $a_1$, $a_2$, $b_1$ and $b_2$ remains unchanged for any locus, and only the constant c varies in accordance with the locus. Where it is assumed that constants of two adjacent loci are $c(i)$ and $c(i+1)$, respectively, the wavelength continuous varying curve can be represented by $$a_1 \cdot I_{DBR} + a_2 \cdot I_{DBR}^2 + b_1 \cdot I_{phase} + b_2 \cdot I_{phase}^2 = (c(i)+c(i+1))/2$$

The control parameter determiner 121 has a function of obtaining those parameters $a_1$, $a_2$, $b_1$, $b_2$ and c.

The determination of the wavelength continuous varying curve is not limited to the above-discussed description. It can also be carried out by fitting to an appropriate function from discretely-detected changing points, or by connecting changing points with straight lines to create a zigzag locus of changing points. It is naturally allowable to obtain the wavelength continuous varying curve considering the hysteresis as in the second embodiment, instead of acquiring the central line between the two adjacent loci of changing points.

The change in the refractive index due to the injection of carriers can be attained much faster than the change in the refractive index due to heat. Accordingly, in the fourth embodiment, power of the SHG light can be stabilized in a shorter period of time, which is advantageous in construction of a system.

In the above-discussed first to fourth embodiments, although the $LiNbO_3$ (LN) device provided with a periodically domain-inverted structure is used as the SHG device, the device is not limited thereto. Other materials, such as ferroelectric material crystals, which include $KTiOPO_4$ (KTP), $LiTaO_3$ (LT), and $KNbO_3$ (KN), and organic nonlinear crystals, can also be used. Further, the periodically domain-inverted structure is not necessary so long as phase matching between the fundamental-wave light and the SHG light can be attained. Furthermore, examples with the fundamental-wave wavelength of 1060 nm are described in the foregoing, but the wavelength is not limited thereto.

Figure 7:
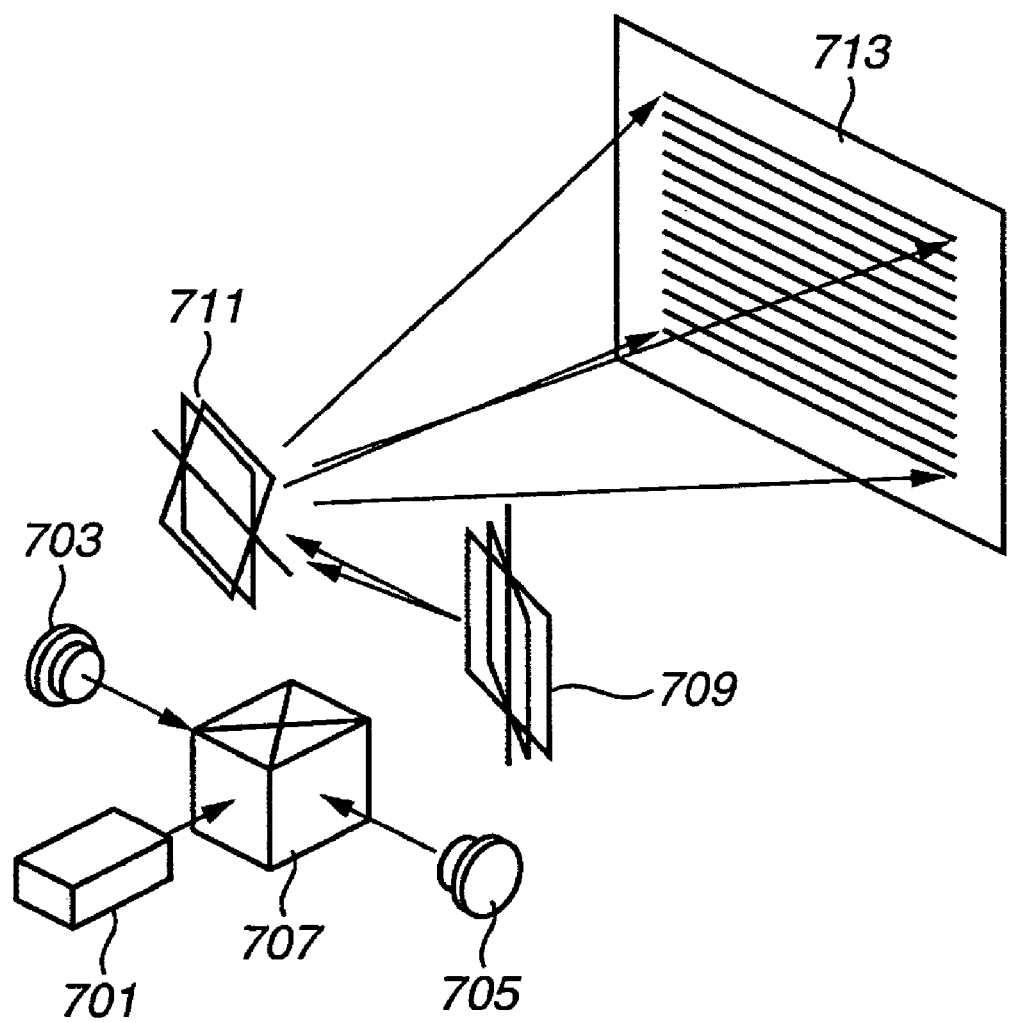
FIG. 7 is a perspective view schematically illustrating a fifth embodiment of an image displaying apparatus according to the present invention.

A fifth embodiment of an image displaying apparatus according to the present invention will be described with reference to FIG. 7. FIG. 7 illustrates the structure of the fifth embodiment.

In FIG. 7, reference numeral 701 designates a green-color light source which is comprised of a light wavelength converting apparatus for emitting green laser light as discussed in the above embodiments, reference numeral 703 designates a red-color light source comprised of a semiconductor laser module, and reference numeral 705 designates a blue-color light source comprised of a semiconductor laser module. Reference numeral 707 designates a dichroic mirror, reference numeral 709 designates a horizontal optical scanning device, reference numeral 711 designates a vertical optical scanning device, and reference numeral 713 designates a screen.

Light beams output from the light sources 701, 703 and 705 are mixed by the dichroic mirror 707. The mixed light beams are scanned by the two optical scanning devices 711 and 713, and scan lines are formed on the screen 713. The light sources 701, 703 and 705 are modulated based on image information of red-color, green-color and blue-color, respectively. A predetermined image can hence be displayed on the screen 713.

A light wavelength converting apparatus according to the present invention has a modulation performance equivalent to that of a semiconductor laser. Therefore, each of the red-color, green-color and blue-color can be modulated in the same manner, so that an image with good quality can be displayed. Further, the size of a light wavelength converting apparatus according to the present invention can be reduced, so that it can be disposed in a housing together with other light sources, optical scanning device and the like. In such a case, a small-sized image displaying apparatus can be achieved.

A light wavelength converting apparatus according to the present invention can also be employed in an optical apparatus such as an image forming apparatus. In such an image forming apparatus, laser light (having a wavelength selected so as to match with a wavelength range of a photosensitive member) emitted from a light wavelength converting apparatus of the present invention undergoes predetermined intensity modulation corresponding to a timing of optical scanning, and is one-dimensionally scanned by an optical scanning system, for example. The scanned laser light forms an image on the photosensitive member through a writing lens.

The photosensitive member is uniformly charged by a charging device, and an electrostatic latent image is formed on a portion of the photosensitive member scanned with the light. A toner image is formed on an image portion of the electrostatic latent image by a developing device. Upon transfer and fixation of the toner image, for example, on a sheet, an image is formed on the sheet. According to a light wavelength converting apparatus of the present invention, an image with good quality can be formed.

While the present invention has been described with respect to what is presently considered to be the preferred embodiments and examples, it is to be understood that the invention is not limited to the disclosed embodiments and examples. The present invention is intended to cover various modifications and equivalent arrangements included within the spirit and the scope of the appended claims.

This application claims priority to Japanese Patent Application No. 2004-142954, filed May 12, 2004, the contents of which are hereby incorporated by reference.

What is claimed is:

1. A light wavelength converting apparatus comprising:
   a semiconductor laser for emitting fundamental-wave light, said semiconductor laser including a gain region, a phase region, and a distributed Bragg reflection (DBR) region provided with a distributed Bragg reflector;
   a nonlinear optical device, said nonlinear optical device being adapted to receive the fundamental-wave light emitted by said semiconductor laser and to output second harmonic wave light of the fundamental-wave light;
   a first optical detector for monitoring an output of the fundamental-wave light;
   a second optical detector, said second optical detector being adapted to monitor the second harmonic wave light such that the second harmonic wave light can be controlled; and
   a control portion for controlling at least a drive current for driving said semiconductor laser, said control portion including a control parameter determiner and a wavelength controller,
   wherein said control parameter determiner is adapted to change a DBR current supplied to said DBR region and a phase current supplied to said phase region to obtain a changing point that corresponds to a discontinuous change in an electrical signal from said first optical detector, and to determine a control parameter for controlling the DBR current and the phase current such that the relationship between the DBR current and the phase current is not located on the changing point, wherein said-wavelength controller is adapted to control the DBR current and the phase current pursuant to the control parameter, such that an oscillation wavelength of said semiconductor laser can be continuously controlled, and
   wherein said control parameter determiner determines the control parameter for controlling the DBR current and the phase current such that the relationship between the DBR current and the phase current is approximately located on a line created by averaging a central line between two adjacent loci of the changing points appearing when the DBR current and the phase current are changed in a forward direction, and a central line between two adjacent loci of the changing points appearing when the DBR current and the phase current are changed in a backward direction, wherein said control parameter determiner determines proportional coefficients a and b, and a constant c in the following formula:

$$a*I_{DBR}^2 + b*I_{phase}^2 = c$$

where $I_{DBR}$ represents the DBR current and $I_{phase}$ represents the phase current.

2. A light wavelength converting apparatus according to claim 1, wherein said control portion includes an SHG output controller for controlling a gain current supplied to said gain region based on an electrical signal from said second optical detector such that the second harmonic wave light can be maintained under a desired condition.

3. A light wavelength converting apparatus according to claim 1, further comprising a temperature monitor for monitoring a temperature of said semiconductor laser, and wherein said wavelength controller stores a correcting coefficient for temperature information from said temperature monitor, and corrects the control parameter determined by said control parameter determiner based on the temperature information from said temperature monitor.

4. A light wavelength converting apparatus according to claim 3, wherein said control parameter determiner determines proportional coefficients a and b, constants c(i) and c(i+1), and a correcting coefficient d in the following formula:

$$a \cdot I_{DBR}^2 + b \cdot I_{phase}^2 = (c(i) + c(i+1))/2 + d \cdot DT$$

where $I_{DBR}$ represents the DBR current, $I_{phase}$ represents the phase current and DT represents an amount of change in temperature.

5. A light wavelength converting apparatus according to claim 1, wherein said semiconductor laser has a structure with a semiconductor layer whose refractive index can be changed when carriers are injected into said semiconductor layer, said semiconductor layer being provided in said DBR region and said phase region.

6. A light wavelength converting apparatus according to claim 1, wherein said semiconductor laser has a structure with at least a heater in which refractive indices of said DBR region and said phase region can be changed when a current is injected into said heater to heat said heater.

7. A light wavelength converting apparatus according to claim 1, wherein said control parameter determiner determines proportional coefficients $a_1$, $a_2$, $b_1$ and $b_2$, and a constant c in the following formula:

$$a_1 \cdot I_{DBR} + a_2 \cdot I_{DBR}^2 + b_1 \cdot I_{phase} b_2 I_{phase}^2 = c/2$$

where $I_{DBR}$ represents the DBR current and $I_{phase}$ represents the phase current.

8. An image projecting apparatus comprising:
   a light wavelength converting apparatus as recited in claim 1; and
   at least an optical scanning device, wherein the second harmonic wave light output by said light wavelength converting apparatus is scanned by said optical scanning device to form an image.

* * * * *

UNITED STATES PATENT AND TRADEMARK OFFICE
CERTIFICATE OF CORRECTION

PATENT NO. : 7,411,992 B2
APPLICATION NO. : 11/120950
DATED : August 12, 2008
INVENTOR(S) : Yukio Furukawa et al.

Page 1 of 1

It is certified that error appears in the above-identified patent and that said Letters Patent is hereby corrected as shown below:

COLUMN 2:
Line 59, "again" should read -- a gain --.

COLUMN 3:
Line 58, "across-sectional" should read -- a cross-sectional --.

COLUMN 11:
Line 56, "said-wavelength" should read -- said wavelength --.

Signed and Sealed this

Tenth Day of March, 2009

JOHN DOLL
*Acting Director of the United States Patent and Trademark Office*